United States Patent
Laursen

(10) Patent No.: US 12,556,139 B2
(45) Date of Patent: Feb. 17, 2026

(54) CLOSED LOOP POWER CONTROL

(71) Applicant: Qorvo US, Inc., Greensboro, NC (US)

(72) Inventor: Søren Deleuran Laursen, Vestbjerg (DK)

(73) Assignee: Qorvo US, Inc., Greensboro, NC (US)

(*) Notice: Subject to any disclaimer, the term of this patent is extended or adjusted under 35 U.S.C. 154(b) by 532 days.

(21) Appl. No.: 18/121,074

(22) Filed: Mar. 14, 2023

(65) Prior Publication Data

US 2023/0318531 A1    Oct. 5, 2023

Related U.S. Application Data

(60) Provisional application No. 63/324,822, filed on Mar. 29, 2022.

(51) Int. Cl.
| | |
|---|---|
| *H03G 3/30* | (2006.01) |
| *H03F 1/02* | (2006.01) |
| *H03F 3/24* | (2006.01) |

(52) U.S. Cl.
CPC ........... *H03F 1/0205* (2013.01); *H03F 3/245* (2013.01); *H03F 2200/126* (2013.01); *H03F 2200/129* (2013.01); *H03F 2200/451* (2013.01)

(58) Field of Classification Search
CPC ....................................................... H03G 3/30
USPC ................................................ 330/279, 278
See application file for complete search history.

(56) References Cited

U.S. PATENT DOCUMENTS

| | | | |
|---|---|---|---|
| 3,641,451 | A | 2/1972 | Hollingsworth et al. |
| 4,019,150 | A | 4/1977 | Lurey et al. |
| 4,122,400 | A | 10/1978 | Medendorp et al. |
| 6,960,956 | B2 | 11/2005 | Pehlke et al. |
| 8,432,224 | B1 | 4/2013 | Woo et al. |
| 10,263,578 | B2 | 4/2019 | Goeritz |
| 2005/0140452 | A1 | 6/2005 | Nagata |
| 2006/0197594 | A1 | 9/2006 | Scuderi et al. |
| 2016/0191002 | A1 | 6/2016 | Ripley et al. |
| 2020/0028472 | A1 | 1/2020 | Scott et al. |

FOREIGN PATENT DOCUMENTS

JP    2005328194 A    11/2005

OTHER PUBLICATIONS

Extended European Search Report for European Patent Application No. 23164407.1, mailed Jul. 31, 2023, 9 pages.

*Primary Examiner* — Henry Choe
(74) *Attorney, Agent, or Firm* — Withrow & Terranova, P.L.L.C.

(57) ABSTRACT

A control system is configured to control an output power of a power amplifier. The control system is operable to detect when the power amplifier is in first state and responsively provide first additional bias to the power amplifier. The first additional bias assists or enables the power amplifier in increasing the output power. The control system is also operable to detect when the power amplifier is in a second state and responsively provide second additional bias to the power amplifier. The second additional bias assists or enables the power amplifier in increasing the amount of output power.

20 Claims, 12 Drawing Sheets

CLOSED LOOP POWER CONTROL

CROSS-REFERENCE TO RELATED APPLICATION

This application claims the benefit of U.S. provisional patent application No. 63/324,822, filed on Mar. 29, 2022, and titled "CLOSED LOOP POWER CONTROL", the disclosure of which is expressly incorporated herein by reference in its entirety.

TECHNICAL FIELD

The present disclosure relates generally to systems and methods for closed loop power control. More particularly, the present disclosure relates to systems and methods for radio frequency (RF) power control.

BACKGROUND

Power amplifiers are typically used in RF systems or devices, where a control system is used to control the output power of the power amplifier. Some control systems use a very large low-dropout (LDO) regulator to control the supply voltage of the power amplifier, including a final stage of the power amplifier. The LDO regulator is typically implemented with a large transistor, such as a large p-type field effect transistor. However, the large transistor consumes a significant amount of area on a die and requires an excellent thermal path, which is not compatible with standard solder bump techniques. Additionally, in some instances, the power amplifier reaches a saturation state where the power amplifier is producing a maximum amount of output power. But the saturation state can create problems with a switching spectrum of the power amplifier.

SUMMARY

The present disclosure relates to closed loop power control for a power amplifier. A control system is operable to detect when the power amplifier is in an early saturation state and responsively provide first additional bias to the power amplifier. The first additional bias assists or enables the power amplifier in increasing the output power. The control system is also operable to detect when the power amplifier is in a saturation state and responsively provide second additional bias to the power amplifier. The second additional bias assists or enables the power amplifier in increasing the amount of output power until the amount of output power reaches a maximum level.

In one aspect, a control system is operable to control an output signal of a power amplifier. The control system includes a detector circuit connected to an output of the power amplifier, a first bias circuit connected to the power amplifier, and a second bias circuit connected to the power amplifier. The detector circuit is operable to detect a reverse voltage on the output of the power amplifier and output a detector signal that provides an indication of a state of the power amplifier. In a non-limiting nonexclusive example, the forward voltage is used for power control and the reverse voltage for amplifier protection. When the power amplifier is in a first state (e.g., an early saturation state), the first bias circuit is operable to provide first additional bias to the power amplifier. When the power amplifier is in a second state (e.g., a saturation state), the second bias circuit is operable to provide second additional bias to the power amplifier.

In another aspect, an RF system includes RF input circuitry and RF output circuitry connected to a power amplifier. A control system is also connected to the power amplifier. The control system includes a detector circuit connected to an output of the power amplifier, a first bias circuit connected to the power amplifier, and a second bias circuit connected to the power amplifier. The detector circuit is operable to detect a reverse voltage on the output of the power amplifier and output a detector signal that provides an indication of a state of the power amplifier. When the power amplifier is in a first state (e.g., an early saturation state), the first bias circuit is operable to provide first additional bias to the power amplifier. When the power amplifier is in a second state (e.g., a saturation state), the second bias circuit is operable to provide second additional bias to the power amplifier.

In yet another aspect, a method of operating a control system includes determining a power amplifier is in a first state (e.g., an early saturation state) based on a first signal level of a detector signal that is output from a detector circuit connected to an output of the power amplifier. The detector circuit is operable to detect a reverse voltage that provides an indication of a state of the power amplifier. Based on determining the power amplifier is in the early saturation state, first additional bias is provided to the power amplifier. The method further includes determining the power amplifier is in a second state (e.g., a saturation state) based on detecting a second signal level of the detector signal, where the second signal level is greater than the first signal level. Based on determining the power amplifier is in the second state (e.g., the saturation state), second additional bias is provided to the power amplifier.

Those skilled in the art will appreciate the scope of the present disclosure and realize additional aspects thereof after reading the following detailed description in association with the accompanying drawings.

BRIEF DESCRIPTION OF THE DRAWINGS

The accompanying drawing figures incorporated in and forming a part of this specification illustrate several aspects of the disclosure and, together with the description, serve to explain the principles of the disclosure.

DETAILED DESCRIPTION

Figure 1:
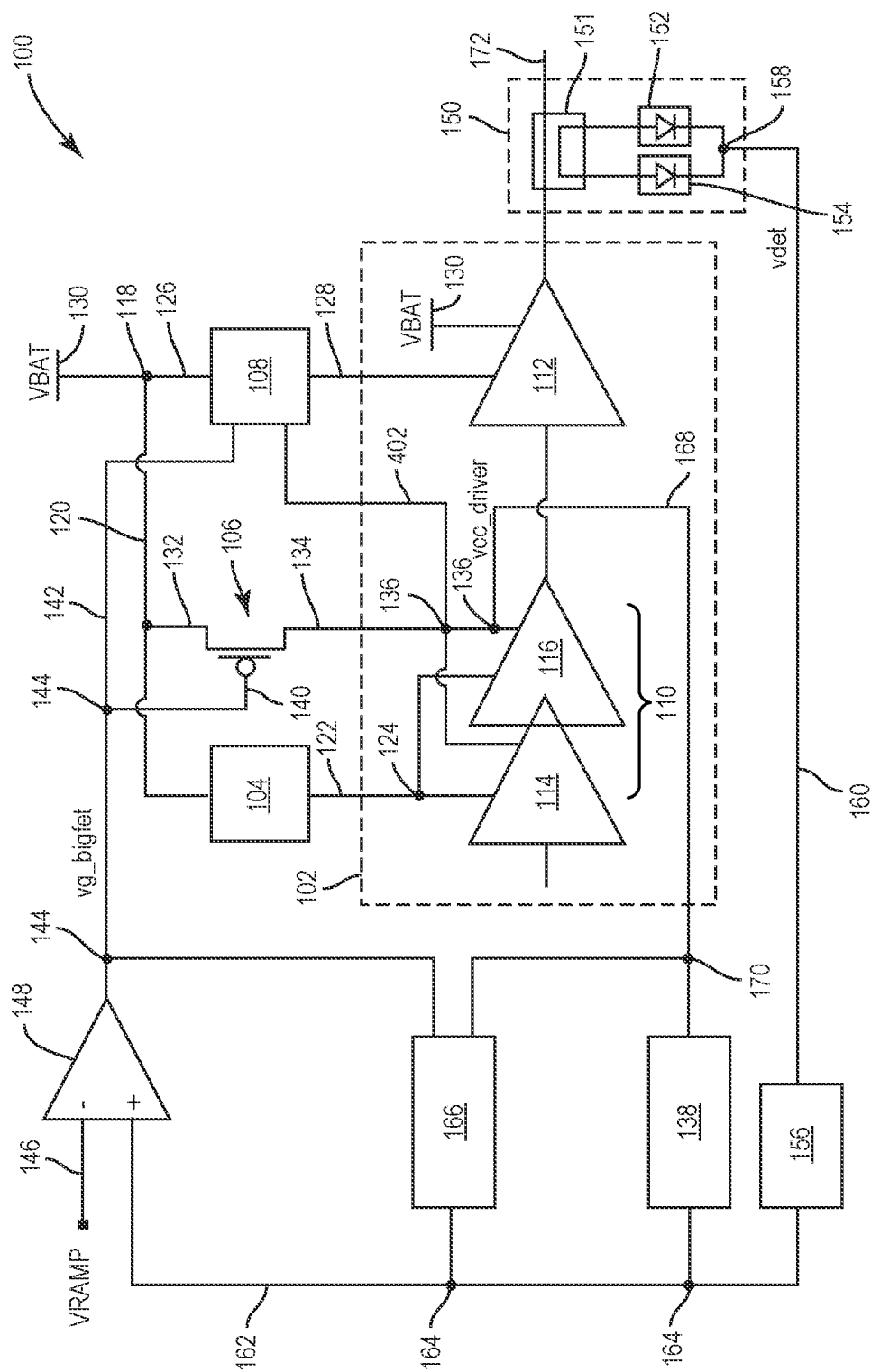
FIG. 1 illustrates an example an example schematic diagram of a control system that can be used for output power control in accordance with embodiments of the disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

A control system is configured to control the output power of a power amplifier. The control system is operable to detect when the power amplifier is in a first state (e.g., an early saturation state) and responsively provide first additional bias to the power amplifier. The first additional bias assists or enables the power amplifier in increasing the output power. Further, the control system is operable to detect when the power amplifier is in a second state (e.g., a saturation state) and responsively provide second additional bias the power amplifier. The second additional bias assists or enables the power amplifier in increasing the amount of output power until the amount of output power reaches a maximum level. In a non-limiting nonexclusive embodiment, the control system is implemented in an RF system where the control system controls an RF output of an RF power amplifier.

FIG. 1 illustrates an example schematic diagram of a control system 100 that can be used for output power control in accordance with embodiments of the disclosure. The control system 100 includes a power amplifier (PA) 102 that is connected to a first bias circuit 104, a second bias circuit 106, and a final bias circuit 108. The first bias circuit 104 and the final bias circuit 108 are operable to provide base bias signals to the PA 102 and the second bias circuit 106 is operable to provide a collector bias signal (e.g., a collector voltage) to the PA 102. In the illustrated embodiment, the second bias circuit 106 is a transistor, such as a p-type field effect transistor (FET), and the PA 102 includes a driver amplifier 110 and a final amplifier 112 connected to the driver amplifier 110, where the driver amplifier 110 is a multistage driver amplifier that includes a two-stage amplifier (a first stage 114 and a second stage 116). The second bias circuit 106 and/or the PA 102 may be implemented differently in other embodiments.

The first bias circuit 104 is connected between a node 118 and the PA 102. A signal line 120 connects an input of the first bias circuit 104 to the node 118 and a signal line 122 connects an output of the first bias circuit 104 to the PA 102 (e.g., to a node 124 that is connected to the first stage 114 and the second stage 116). The final bias circuit 108 is connected between the node 118 and the PA 102. A signal line 126 connects an input of the final bias circuit 108 to the node 118 and a signal line 128 connects an output of the final bias circuit 108 to the PA 102 (e.g., to the final amplifier 112). The node 118 is connected to a voltage source (VBAT) 130. The voltage source (VBAT) 130 is also connected to the final amplifier 112. In a non-limiting nonexclusive example, the voltage source (VBAT) 130 is a direct current (DC) voltage source, such as a battery in an electronic device. In certain embodiments, the electronic device is an RF electronic device. Example RF electronic devices include, but are not limited to, a cellular telephone, a remote control device, an alarm system, and a Wi-Fi device.

In the illustrated embodiment, the second bias circuit 106 is a p-type field effect transistor, but different types of bias circuits may be used in other embodiments. The second bias circuit 106 is connected between the signal line 120 and the PA 102. In the illustrated embodiment, a first terminal 132 of the second bias circuit 106 connects to the signal line 120 and a second terminal 134 of the second bias circuit 106 connects to the PA 102 (e.g., to a node 136 that is connected to the first stage 114, the second stage 116, the final bias circuit 108, and to a feedback circuit 138). As described earlier, the second bias circuit 106 provides the collector bias signal to the PA 102 (e.g., to the first stage 114 and the second stage 116). A third terminal 140 (e.g., a gate) is connected to a signal line 142 via a node 144.

A VRAMP signal on signal line 146 is input into a first input of an amplifier circuit 148. In one embodiment, the amplifier circuit 148 is an operational amplifier circuit. An output of the amplifier circuit 148 is connected to the second bias circuit 106 and to the final bias circuit 108 via the signal line 142. A detector circuit 150 is connected to the output of the PA 102. The detector circuit 150 is operable to detect an envelope of an RF signal (e.g., forward and reverse voltages). In one embodiment, the detector circuit 150 includes a directional coupler 151 connected to a first diode 152 and a second diode 154. The first diode 152 and the second diode 154 each function as a peak detector in the control system 100. One diode (e.g., the first diode 152) monitors the forward power and helps maintain a steady forward power in voltage standing wave ratio (VSWR) conditions. The other diode (e.g., the second diode 154) senses the reverse power caused by a load reflection (e.g., a reflection from an antenna). In certain embodiments, the forward voltage is used for power control, and the reverse voltage is used for amplifier protection. The first diode 152 and the second diode 154 are at the output of the PA 102 to enable a single feedback signal to be routed through the control system 100 from the detector circuit 150 to the amplifier circuit 148.

A scaling circuit 156 is connected to an output of the detector circuit 150 (e.g., at node 158) via a signal line 160. A signal line 162 connects the scaling circuit 156 to a second input of the amplifier circuit 148 (e.g., at a node 164). The feedback circuit 138 is also connected to the node 164. A saturation correction circuit 166 is connected between the node 144 and the node 164. The saturation correction circuit 166 is also connected to the node 136 via the signal line 168 (e.g., at a node 170 on the signal line 168).

Figure 10:
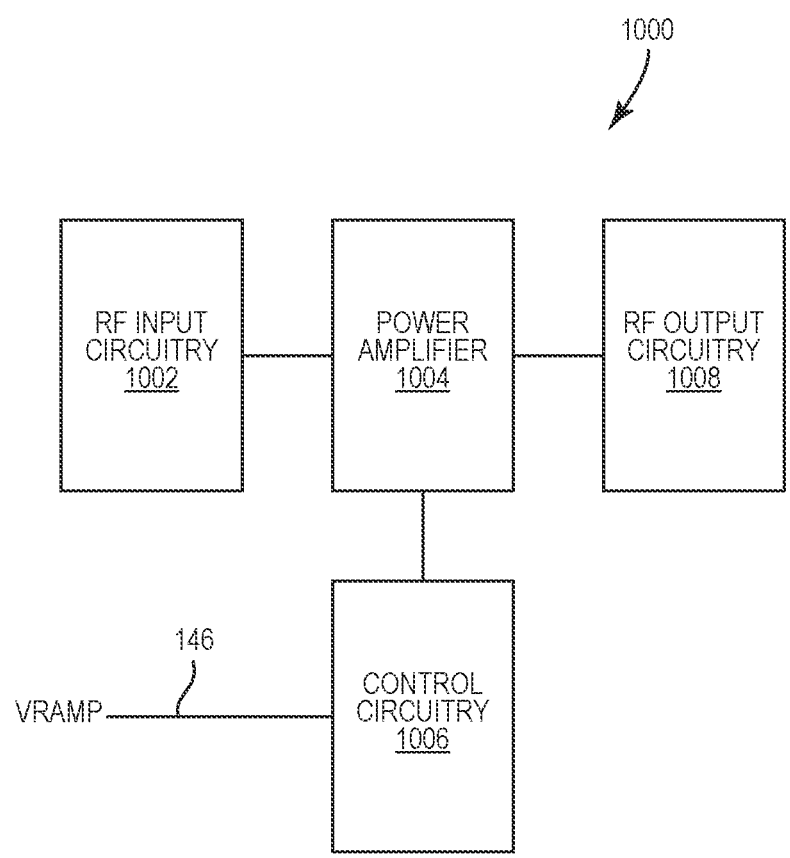
FIG. 10 illustrates an example RF system that can include one or more control systems in accordance with embodiments of the disclosure.

An output signal line 172 of the PA 102 is connected to RF output circuitry (e.g., RF output circuitry 1008 in FIG. 10). The RF output circuitry can include one or more antennas. In certain embodiments, the RF output circuitry is implemented on one die, the PA 102 on a second die, and the remaining components in FIG. 1 are implemented on a bulk complementary metal oxide semiconductor die and controlled by a serial logic interface. Other embodiments are not limited to this configuration and the components in FIG. 1 may be implemented on one or more dies.

In the control system 100, an output signal output by the PA 102 on the output signal line 172 is connected to the detector circuit 150 using the directional coupler 151 and is rectified to produce a detector signal (a vdet signal). The amplifier circuit 148 compares the vdet signal to the VRAMP signal. The VRAMP signal is a voltage (e.g., an analog voltage) that is proportional to a desired output RF voltage. In certain embodiments, the VRAMP signal is set or defined by a user (e.g., an electronic device manufacturer). The output of the amplifier circuit 148 is connected to the second bias circuit 106. By varying the voltage that is received by the second bias circuit 106 (e.g., received at the third terminal 140), the voltage (a vcc_driver signal) that is received from the second bias circuit 106 (e.g., received at the node 136) is adjusted until the control system 100 reaches (or substantially reaches) an equilibrium state. In certain embodiments, the second bias circuit 106 turns off when the vg_bigfet signal on the signal line 142 is close to zero. When the vcc_driver signal reaches VBAT 130, the control system 100 is producing a maximum amount of output power (the highest amount of output power that can be produced). In some instances, before the vcc_driver signal reaches VBAT 130, there may be signs of saturation. The control system 100 assesses saturation in two ways: (1) by measuring the vcc_driver signal relative to VBAT, and (2) by monitoring the vg_bigfet signal that is received by the second bias circuit 106 and the final bias circuit 108 on the signal line 142.

In some embodiments, the control system 100 categorizes saturation into one of two states: (1) an early saturation state, which is characterized by the vcc_driver signal being one (1) to two (2) volts (V) below VBAT 130; and (2) a saturation state where the vg_bigfet signal is approaching zero (0) volts. Detection of the early saturation state enables the control system 100 to take action before the PA 102 is adversely affected.

Saturation in the system may cause problems with a switching spectrum of the PA 102 in low-voltage conditions. Saturation is prevented or corrected by opening a feedback path from the vcc_driver signal to the vdet signal. The feedback path causes the control system 100 to operate as equilibrium has been achieved and can force the control system 100 out of saturation. In certain embodiments, the control system 100 employs two separate feedback paths in the saturation correction circuit 166, a first feedback path for the early saturation state and a second feedback path for the saturation state.

Figure 2:
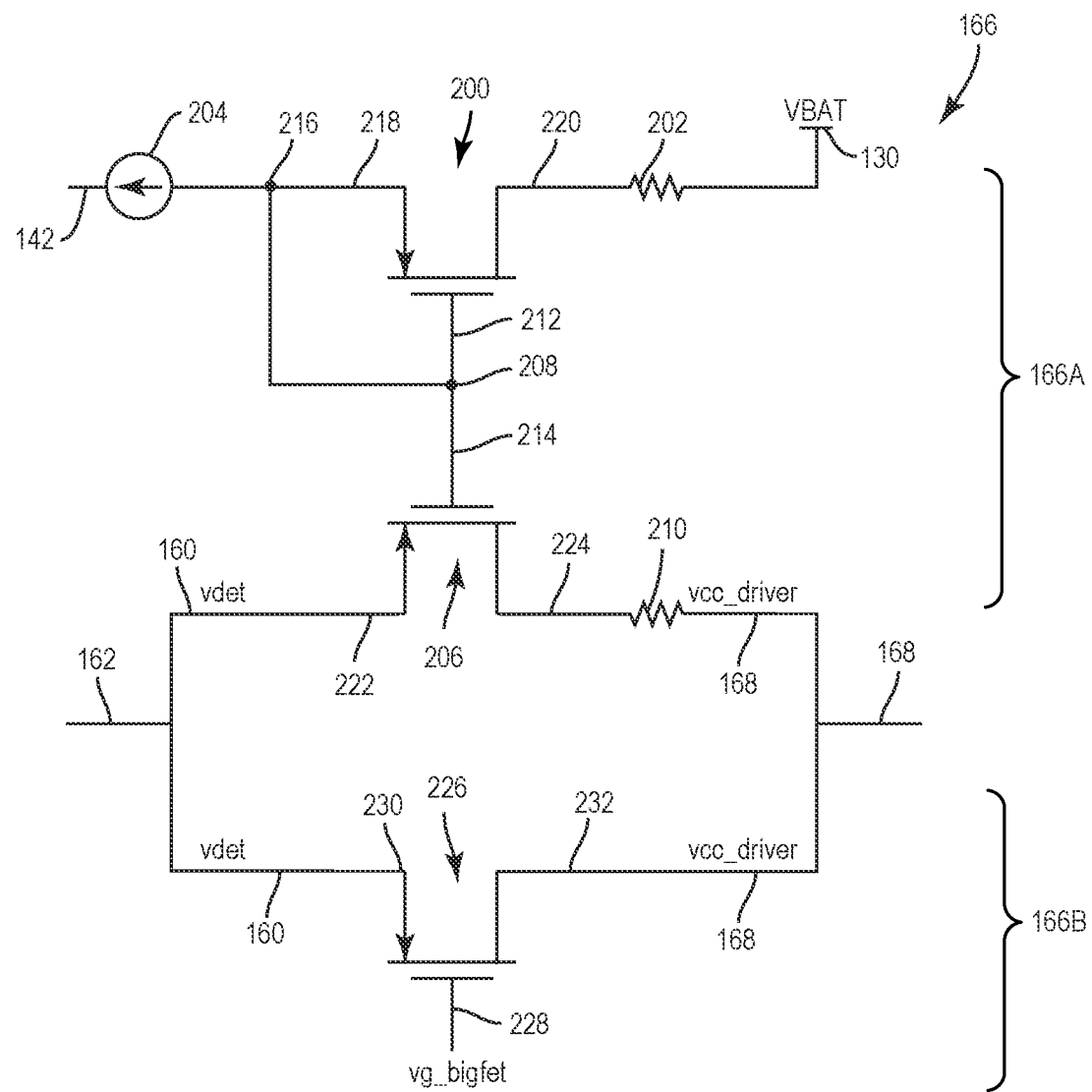
FIG. 2 illustrates an example schematic diagram of the saturation correction circuit shown in FIG. 1 in accordance with embodiments of the disclosure.

FIG. 2 illustrates a schematic diagram of an example of the saturation correction circuit 166 shown in FIG. 1 in accordance with embodiments of the disclosure. Generally, the saturation correction circuit 166 is operable to provide the two feedback paths between the vcc_driver signal and the vdet signal when the vcc_driver signal approaches VBAT 130. The schematic diagram depicts one example of a saturation correction circuit 166. However, other embodiments are not limited to this implementation. The saturation correction circuit 166 may be implemented with different (e.g., equivalent) components in other embodiments.

The saturation correction circuit 166 includes a first circuit 166A and a second circuit 166B. The first circuit 166A forms the first feedback path that operates when the PA is in the early saturation state. The first circuit 166A connects to VBAT 130, the signal line 142 (the vg_bigfet signal), the signal line 160 (the vdet signal), and the signal line 168 (the vcc_driver signal) shown in FIG. 1. The first circuit 166A includes a first switch 200, a first resistor 202 connected between VBAT 130 and the first switch 200, and a current source 204 that is operable to transmit current from VBAT 130 when the first switch 200 is turned on. The first switch 200 is connected to a second switch 206 at a node 208, and the second switch 206 is connected to a second resistor 210.

In the illustrated embodiment, the first switch 200 is a first transistor and the second switch 206 is a second transistor (e.g., p-type transistors such as p-type field effect transistors (pFETs)). At the node 208, a first terminal 212 (e.g., a gate) of the first transistor is connected to the first terminal 214 (e.g., the gate) of the second transistor. The node 208 is connected to a node 216, where the node 216 is between the current source 204 and a second terminal 218 of the first transistor. The first resistor 202 is connected between VBAT 130 and a third terminal 220 of the first transistor. The second terminal 222 of the second transistor is connected to the signal line 160 (the vdet signal). The second resistor 210 is connected to the third terminal 224 of the second transistor on signal line 168 (the vcc_driver signal).

The second circuit 166B of the saturation correction circuit 166 forms the second feedback path that operates in the saturation state. The second circuit 166B includes a third switch 226 connected between the signal line 160 (the vdet signal) and the signal line 168 (the vcc_driver signal). In FIG. 2, the third switch 226 is a third transistor (e.g., a p-type transistor). The first terminal 228 (e.g., the gate) of the third transistor connects to the signal line 142 (the vg_bigfet signal). The second terminal 230 of the third transistor connects to the signal line 160 (the vdet signal). The third terminal 232 of the third transistor connects to the signal line 168 (the vcc_driver signal).

The saturation correction circuit 166 is operable to operate in two modes. In the first mode, the saturation correction circuit 166 is turned off (e.g., an off mode), and in the second mode, the saturation correction circuit is turned on (e.g., an on mode). The first circuit 166A establishes a first threshold level (Vt1) at the node 208 (e.g., at the first terminal 212 of the first transistor and at the first terminal 214 of the second transistor), where Vt1 is below VBAT 130. The saturation correction circuit 166 is in the off mode when the vcc_driver signal is below Vt1. The saturation correction circuit 166 is in the on mode when the vcc_driver signal is above Vt1. In the on mode and when the PA is in the early saturation state, current flows from the signal line 168 (the vcc_driver signal) to the signal line 160 (the vdet signal) in the first circuit 166A, which has the effect of increasing the signal level of the vdet signal. In the on mode and when the PA is in the saturation state, current flows from the signal line 168 (the vcc_driver signal) to the signal line 160 (the vdet signal) in the second circuit 166B. The second circuit 166B provides a strong feedback path since there is no resistor in series with the third switch 226. Additionally, when the third switch 226 is implemented as a transistor, the transistor sees a large gate-source voltage when the PA is in the saturation state.

The second bias circuit (e.g., the second bias circuit 106 in FIG. 1) provides the vcc_driver signal. When a signal level of the vcc_driver signal equals or exceeds Vt1, current flows from the vcc_driver signal to the vdet signal, which increases the signal level (e.g., voltage) of the vdet signal. The increase in the signal level of the vdet signal causes the output from the second bias circuit to decrease.

When the vdet signal is at the first signal level, the second bias circuit responsively provides first additional bias to the PA. When the vdet signal is at the higher second signal level, the second bias circuit can turn off and the final bias circuit (e.g., the final bias circuit 108 in FIG. 1) provides second additional bias to the PA. At some point, the signal level of the output signal on the output signal line 172 is reduced such that the output signal is less than the output power that was defined by the user. In a non-limiting nonexclusive example, VBAT 130 is three and a half (3.5) V and Vt1 is two and a half (2.5) V.

The first circuit 166A and the second circuit 166B enable a two-step operation of the saturation correction circuit 166. The first circuit 166A is operable to prevent saturation or at least reduce the chances that the PA will enter saturation. When saturation occurs, the second circuit 166B is operable to drive the PA out of compression. This two-step operation assists the PA in having a smoother response, which improves or stabilizes an output spectrum of the PA.

Figure 3:
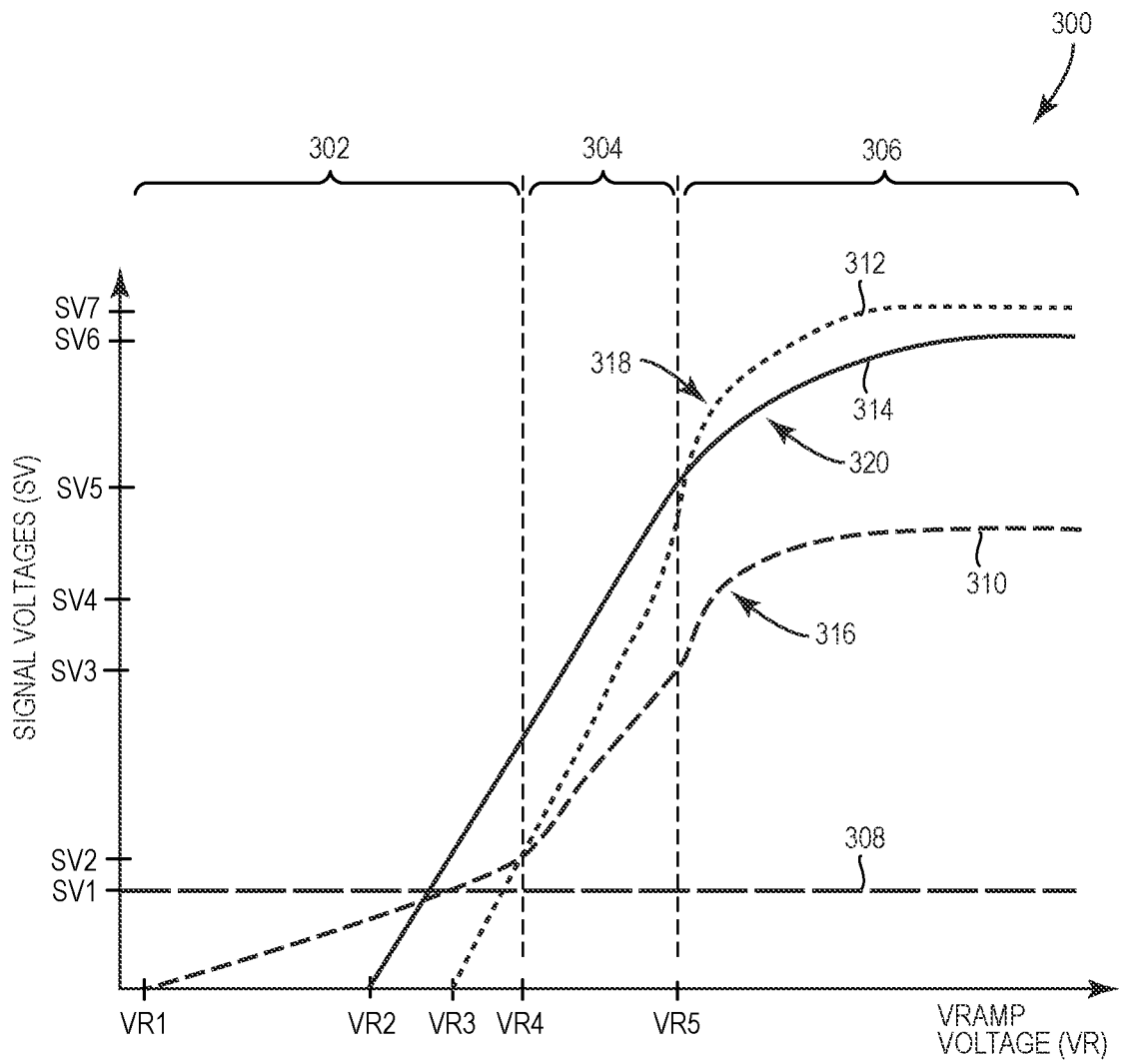
FIG. 3 illustrates an example graph that depicts operation of the control system 100 shown in FIG. 1 in accordance with embodiments of the disclosure.

FIG. 3 illustrates an example graph 300 that depicts operation of the control system 100 shown in FIG. 1 in accordance with embodiments of the disclosure. FIG. 3 is described with reference to FIG. 1. The horizontal axis represents a signal level of the VRAMP signal (VR; in V) and the vertical axis represents signal levels (SV; in V) of multiple signals. The multiple signals are the vcc_driver signal, the vg_bigfet signal, the first base bias signal output by the first bias circuit 104 (plot 308), the second base bias signal output by the final bias circuit 108 (plot 310), the collector bias signal output by the second bias circuit 106 (plot 312), and the output signal output from the PA (plot 314).

The graph 300 includes a first section that represents an unsaturated state 302 of the PA, a second section that represents an early saturation state 304 of the PA, and a third section that represents a saturation state 306 of the PA. The plot 308 represents the first base bias signal output by the first bias circuit 104 on signal line 122. The plot 308 is constant at SV1 and is not dependent on the signal level of the VRAMP signal during the unsaturated state 302, the early saturation state 304, and the saturation state 306. Other embodiments are not limited to this configuration. At least a portion of the plot 308 can be dependent on the VRAMP signal in other embodiments.

The plot 310 represents a second base bias signal output by the final bias circuit 108 on the signal line 128. In the unsaturated state 302, the plot 310 does not begin to increase until a signal level of VRAMP reaches VR1. At VR1, the plot 310 increases linearly (or substantially linearly) at a first slope as the VRAMP signal increases. At VR4 and SV2 (when the vcc_driver signal approaches VBAT), the PA enters the early saturation state 304 and the plot 310 continues to increase linearly (or substantially linearly) with the VRAMP signal but at a steeper second slope. The steeper second slope shows the final bias circuit 108 is providing increasing signal levels of the second base bias signal to the PA to assist or enable the PA in providing increasing output signal levels on the output signal line 172. At VR5 and SV3

Figure 4A:
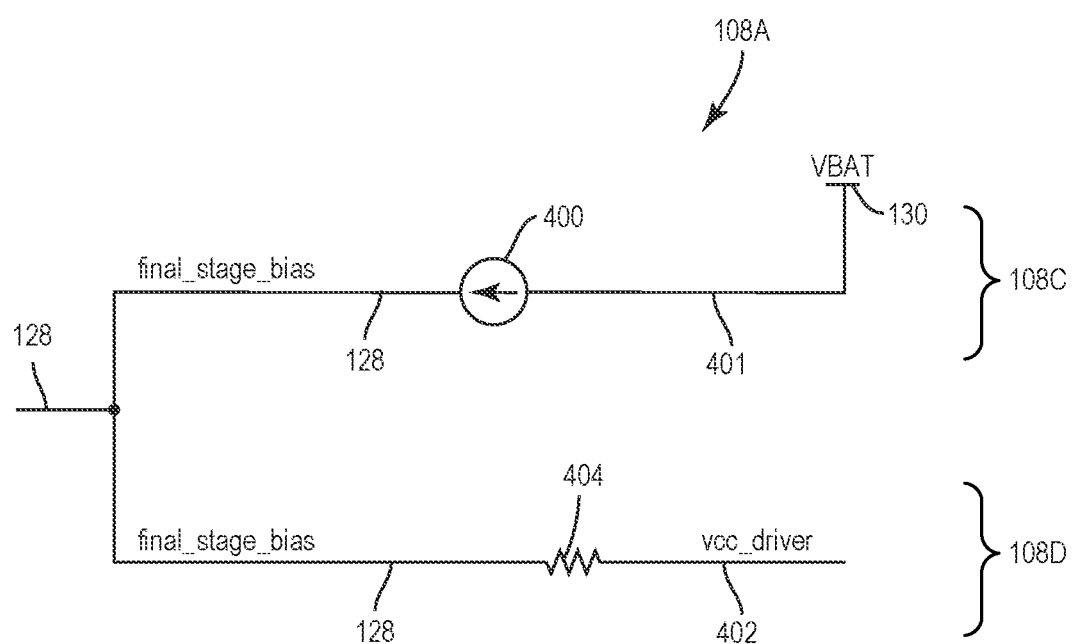
FIG. 4A illustrates a schematic diagram of an example of a first portion of the final bias circuit shown in FIG. 1 in accordance with embodiments of the disclosure.
Figure 4B:
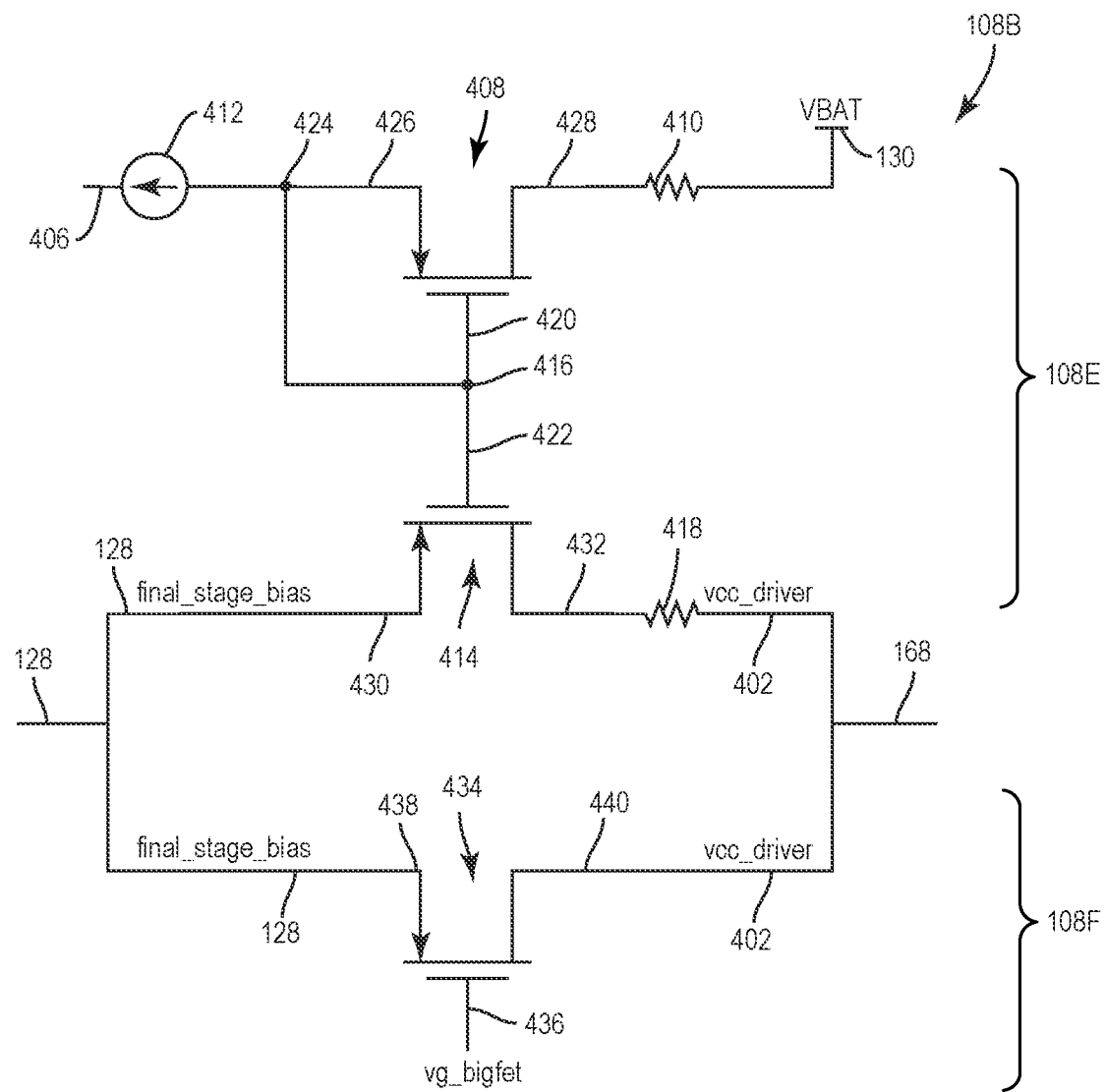
FIG. 4B illustrates a schematic diagram of an example of a second portion of the final bias circuit shown in FIG. 1 in accordance with embodiments of the disclosure.

(when the vg_bigfet signal approaches zero), the PA enters the saturation state 306 and the plot 310 continues to increase but at a steeper third slope (indicated by arrow 316) as the VRAMP signal levels increase until the second base bias signal reaches a maximum signal level at SV4. At the maximum signal level, the second base bias signal does not increase in response to increasing VRAMP signal levels. The steeper third slope shows the final bias circuit 108 is providing increasing signal levels of the second base bias signal to the PA to assist or enable the PA in increasing the output signal levels on the output signal line 172 (FIG. 1). At SV4, the final bias circuit is providing a substantially constant signal level to the PA. FIGS. 4A-4B illustrate an example final bias circuit that can produce the shape of the plot 310.

The plot 312 represents a collector bias signal output by the second bias circuit 106. In the unsaturated state 302, the plot 312 does not begin to increase as the VRAMP signal increases until VR3. At VR3, the plot 310 increases linearly (or substantially linearly) at a fourth slope as the VRAMP signal increases. When the PA is in the early saturation state 304 and as the plot 312 approaches the saturation state 306, the slope of the plot 312 increases to a steeper fifth slope (at approximately SV4). The steeper fifth slope shows the second bias circuit 106 is providing increasing signal levels to the PA to assist or enable the PA in increasing the signal level of the output signal on the output signal line 172. In the saturation state 306, the plot 312 continues to increase with the VRAMP signal but at a reduced sixth slope (indicated by arrow 318) until the plot 312 reaches a maximum signal level at SV7.

In certain embodiments, a desired behavior for the collector bias signal (e.g., a shape of plot 312) is created based on the design of the control system 100 and on a desired operation of the PA. For example, the vg_bigfet signal, the vdet signal, the vcc_driver signal, the voltage of VBAT, the operation of the saturation correction circuit, the operation of the PA, and the operation of the second bias circuit are considered when determining the shape of the plot 312.

The plot 314 represents the output signal from the PA on the output signal line 172. In the unsaturated state 302, the plot 314 does not begin to increase as the VRAMP signal increases until VR2. At VR2, the plot 314 increases linearly (or substantially linearly) at a seventh slope as the VRAMP signal increases. When the PA enters the saturation state 306 (at VR5 and SV5), the plot 314 increases initially at a reduced eighth slope (identified by arrow 320) until the plot 314 reaches a maximum level at SV6.

FIG. 4A illustrates an example first portion 108A of the final bias circuit 108 shown in FIG. 1 in accordance with embodiments of the disclosure. FIG. 4B illustrates a schematic diagram of an example second portion 108B of the final bias circuit 108 shown in FIG. 1 in accordance with embodiments of the disclosure. The combination of the first portion 108A and the second portion 108B depicts an example of the final bias circuit (e.g., the final bias circuit 108 in FIG. 1) that is operable to produce the plot 310 in FIG. 3.

The first portion 108A of the final bias circuit 108 includes a first circuit 108C and a second circuit 108D. In the first circuit 108C, a current source 400 is connected to VBAT 130 via signal line 401. The current source 400 transmits the second base bias signal (a final_stage_bias signal in FIGS. 4A-4B) on signal line 128 to the PA (e.g., the final amplifier 112 of the PA 102 in FIG. 1). The first circuit 108C provides a constant current to the PA.

The second circuit 108D includes a resistor 404 that receives the vcc_driver signal on signal line 402 (FIG. 1) and transmits the final_stage_bias signal on signal line 128 to the PA. The second circuit 108D is designed to create the plot 310 during the unsaturated state 302 (e.g., the plot 310 between VR1 and VR4).

The second portion 108B of the final bias circuit 108 in FIG. 4B includes a third circuit 108E and a fourth circuit 108F. The third circuit 108E connects to VBAT 130, signal line 406, the signal line 128 (the final_stage_bias signal), and the signal line 402 (the vcc_driver signal) shown in FIG. 1. The third circuit 108E includes a first switch 408, a first resistor 410 connected between VBAT 130 and the first switch 408, and a current source 412 that is operable to transmit current from VBAT 130 when the first switch 408 is turned on. The first switch 408 is connected to a second switch 414 at a node 416, and the second switch 414 is connected to a second resistor 418.

In the illustrated embodiment, the first switch 408 is a first transistor and the second switch 414 is a second transistor (e.g., p-type transistors such as p-type field effect transistors (pFETs)). At the node 416, a first terminal 420 (e.g., a gate) of the first transistor is connected to the first terminal 422 (e.g., the gate) of the second transistor. The node 416 is connected to a node 424, where the node 424 is between the current source 412 and a second terminal 426 of the first transistor. The first resistor 410 is connected between VBAT 130 and a third terminal 428 of the first transistor. The second terminal 430 of the second transistor is connected to the signal line 128 (the final_stage_bias signal). The second resistor 418 is connected to the third terminal 432 of the second transistor on signal line 402 (the vcc_driver signal).

The third circuit 108E is used to establish the threshold level Vt1. Vt1 determines the signal level of the VRAMP signal where the first transition occurs in the plot 310 (e.g., at VR4 in FIG. 3). At VR4, the PA enters the early saturation state 304. As described earlier, the second bias circuit 106 provides increasing signal levels of the collector bias signal (e.g., the first additional bias) to the PA when the vcc_driver signal approaches VBAT 130. As described earlier, in some embodiments, the second bias circuit 106 turns off when signal vg_bigfet on the signal line 142 (FIG. 1) is close to zero.

The fourth circuit 108F includes a third switch 434 connected between the signal line 128 (the final_stage_bias signal) and the signal line 402 (the vcc_driver signal). In FIG. 4B, the third switch 434 is a third transistor (e.g., a p-type transistor). The first terminal 436 (e.g., the gate) of the third transistor connects to the signal line 142 (the vg_bigfet signal). The second terminal 438 of the third transistor connects to the signal line 128 (the final_stage_bias signal). The third terminal 440 of the third transistor connects to the signal line 402 (the vcc_driver signal).

Figure 5:
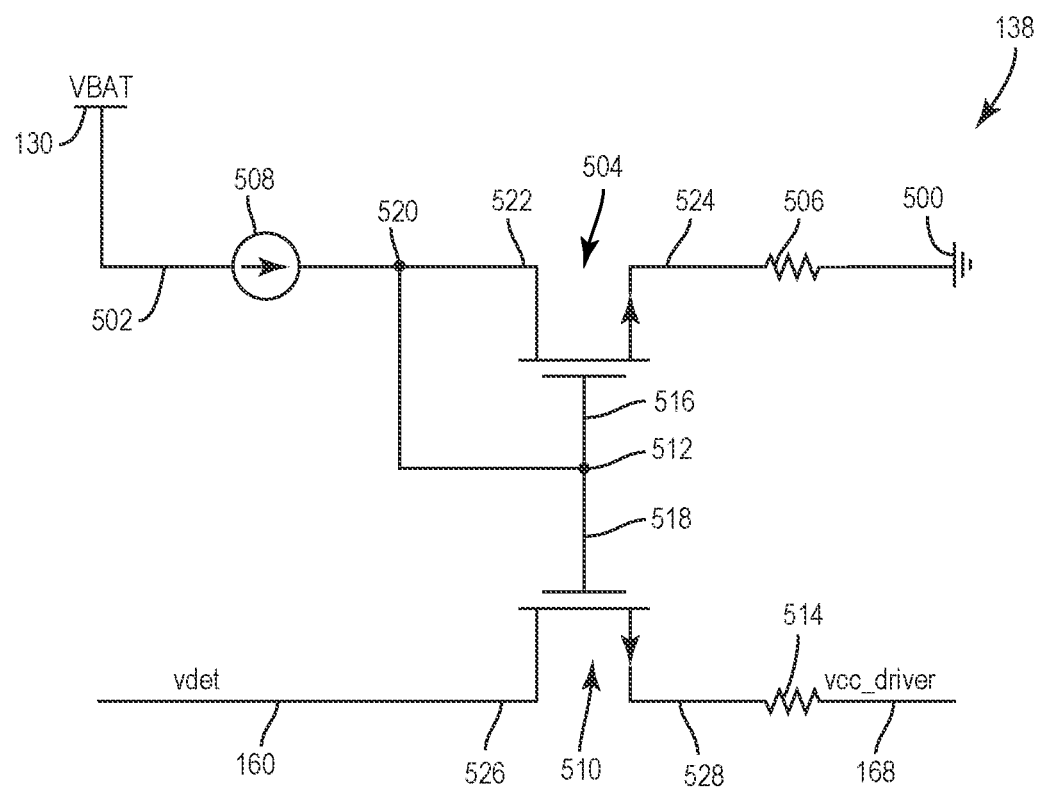
FIG. 5 illustrates an example schematic diagram of the feedback circuit shown in FIG. 1 in accordance with embodiments of the disclosure.

The fourth circuit 108F is designed to create the second transition in the plot 310 (e.g., at VR5 in FIG. 5). At VR5, the PA enters the saturation state 306. The second transition in the plot 310 represents the point at which the final bias circuit 108 provides increasing signal levels (e.g., second additional bias) to the PA.

In some instances, a small change in the signal level of the VRAMP signal can result in a large change in the output signal on the output signal line 172 (FIG. 1). The feedback circuit 138 in FIG. 1 is used to produce a feedback signal that causes a change in the signal level of the output signal to correspond to a magnitude of the signal level change in the VRAMP signal. FIG. 5 illustrates an example schematic diagram of the feedback circuit 138 shown in FIG. 1 in accordance with embodiments of the disclosure. The schematic diagram depicts one example of a feedback circuit 138. However, other embodiments are not limited to this implementation. The feedback circuit 138 may be implemented with different (e.g., equivalent) components in other embodiments.

The feedback circuit 138 connects to a reference voltage 500 (e.g., ground), a signal line 502, the signal line 160 (the vdet signal), and the signal line 168 (the vcc_driver signal) shown in FIG. 1. In some embodiments, the signal line 502 is connected to VBAT 130. The feedback circuit 138 includes a first switch 504, a first resistor 506 connected between the reference voltage 500 and the first switch 504, and a current source 508 that is operable to transmit current to the first switch 504. The first switch 504 is connected to a second switch 510 at a node 512, and the second switch 510 is connected to a second resistor 514.

In the illustrated embodiment, the first switch 504 is a first transistor and the second switch 510 is a second transistor (e.g., n-type transistors such as nFETs). At the node 512, a first terminal 516 (e.g., a gate) of the first transistor is connected to the first terminal 518 (e.g., the gate) of the second transistor. The node 512 is connected to a node 520, where the node 520 is between the current source 508 and a second terminal 522 of the first transistor. The first resistor 506 is connected between the reference voltage 500 and a third terminal 524 of the first transistor. The second terminal 526 of the second transistor is connected to the signal line 160 (the vdet signal). The second resistor 514 is connected to the third terminal 528 of the second transistor on the signal line 168 (the vcc_driver signal).

The current source 508 and the first resistor 506 establish a second threshold level (Vt2). When the signal level of the vcc_driver signal is greater than Vt2, the feedback circuit 138 is in an off state. When the signal level of the vcc_driver signal is less than Vt2, the feedback circuit 138 is in an on state and current flows through the second resistor 514 to the signal line 160 (e.g., current is conducted from the vcc_driver signal to the vdet signal). As described earlier, the vdet signal functions as a feedback signal that is received at the second input of the amplifier circuit 148 (FIG. 1).

Figure 6:
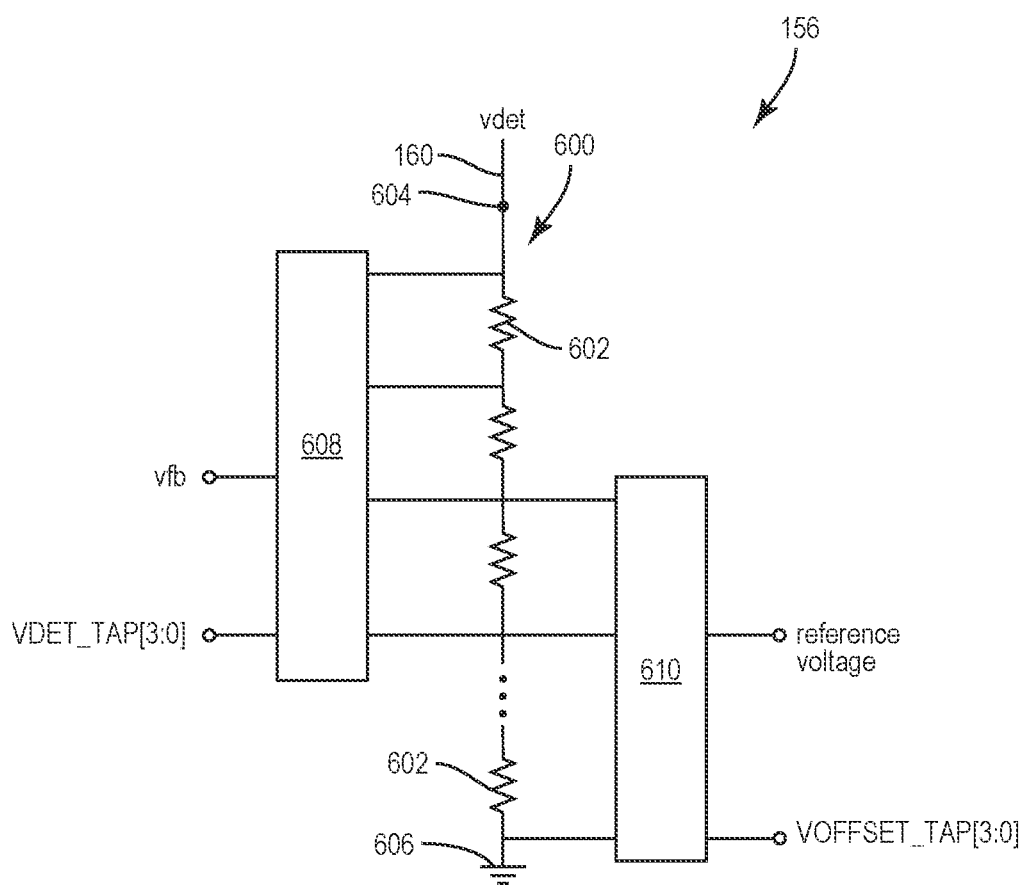
FIG. 6 illustrates an example schematic diagram of the scaling circuit shown in FIG. 1 in accordance with embodiments of the disclosure.

FIG. 6 illustrates an example schematic diagram of the scaling circuit 156 shown in FIG. 1 in accordance with embodiments of the disclosure. The scaling circuit 156 allows the control system to support more than one RF band. The illustrated scaling circuit 156 is implemented as a tapped resistor array, although other embodiments are not limited to this configuration. The scaling circuit 156 is operable to scale the vdet signal to a rated power at a desired value of VRAMP.

The vdet signal is received on the signal line 160. A string 600 of resistors 602 are connected in series between a node 604 on the signal line 160 and a reference voltage 606 (e.g., ground). The string 600 of resistors 602 is connected to a first series of switches 608 and to a second series of switches 610. The vdet signal is tapped at a given point along the string 600 of resistors 602 using a switch in the first series of switches 608 and a switch in the second series of switches 610. In a non-limiting nonexclusive example, the switches in the first series of switches 608 and the second series of switches 610 are n-type transistors (e.g., nFETs). Vfib can be the node 164 in FIG. 1, VDET_TAP is a digital control word that controls the first series of switches 608, and Voffset_tap is a digital control word that controls the second series of switches 610.

In some instances, the impedance of an antenna can change during operation of the PA. Typically, the impedance of an antenna is at a known impedance (e.g., fifty (50) ohms). But in certain situations, the impedance of the antenna can increase above the fifty (50) ohm impedance or decrease below the fifty (50) ohm impedance during operation of the PA. The vdet signal produced by the detector circuit 150 (FIG. 1) can cause the operation of the control system to be adjusted based on changes in the impedance of the antenna. The adjustments provide additional bias to the PA to adjust the output signal of the PA.

Figure 7:
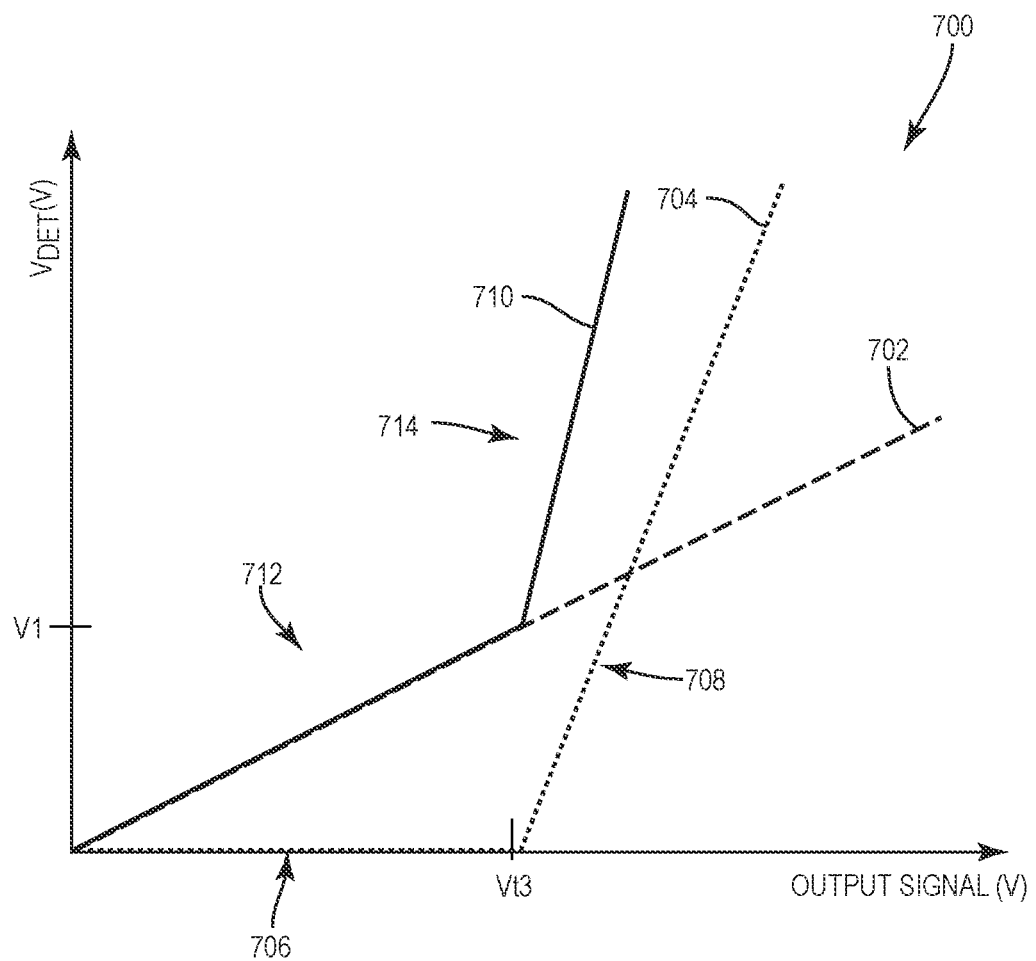
FIG. 7 illustrates an example graph of the operation of the detector circuit shown in FIG. 1 in accordance with embodiments of the disclosure.

FIG. 7 illustrates an example graph 700 of the operation of the detector circuit 150 shown in FIG. 1 in accordance with embodiments of the disclosure. The vertical axis represents a signal level of the vdet signal in V, and the horizontal axis represents a signal level of the output signal from the PA in V. A plot 702 represents the forward power of the output signal that is detected by the detector circuit 150 shown in FIG. 1 (e.g., by one of the first diode 152 or the second diode 154). The plot 702 is a first part of the vdet signal. The forward power is proportional to output signal and represents the amount of the output signal that is transmitted to the antenna or an antenna switch.

The plot 704 represents the reverse power of the output signal that is detected by the detector circuit 150 (e.g., by one of the first diode 152 or the second diode 154). The plot 704 is a second part of the vdet signal. The reverse power is caused by load reflection (e.g., reflection from the antenna). The plot 704 includes a first region 706 and a second region 708. In the first region 706, the plot 704 of reverse power is at zero. At a third threshold value (Vt3) of the output signal, the plot 704 begins to increase. In the second region 708, the plot 704 continues to increase as the signal level of the output signal increases. In certain embodiments, Vt3 is set by setting the bias voltage of the reverse voltage detector (e.g., one of the first diode 152 or the second diode 154) lower than a diode forward voltage, or by applying the output of the reverse voltage detector to a nonlinear circuit, such as a series diode or a FET.

The plot 710 represents a sum of the plot 702 and the plot 704. The plot 710 represents the vdet signal. The plot 710 includes a third region 712 and a fourth region 714. In the third region 712, plot 710 corresponds to the plot 702 since the signal level of the plot 704 is at zero. At Vt3, the plot 704 begins to increase, which causes the plot 710 to increase. As described in conjunction with FIG. 2, the vdet signal is produced when the vcc_driver signal is above Vt1, which indicates the PA is in the early saturation state.

In the fourth region 714, the plot 710 continues to increase as the signal level of the output signal increases. At some point, the signal level of the vdet signal indicates the PA has transitioned from the early saturation state to the saturation state.

Figure 8:
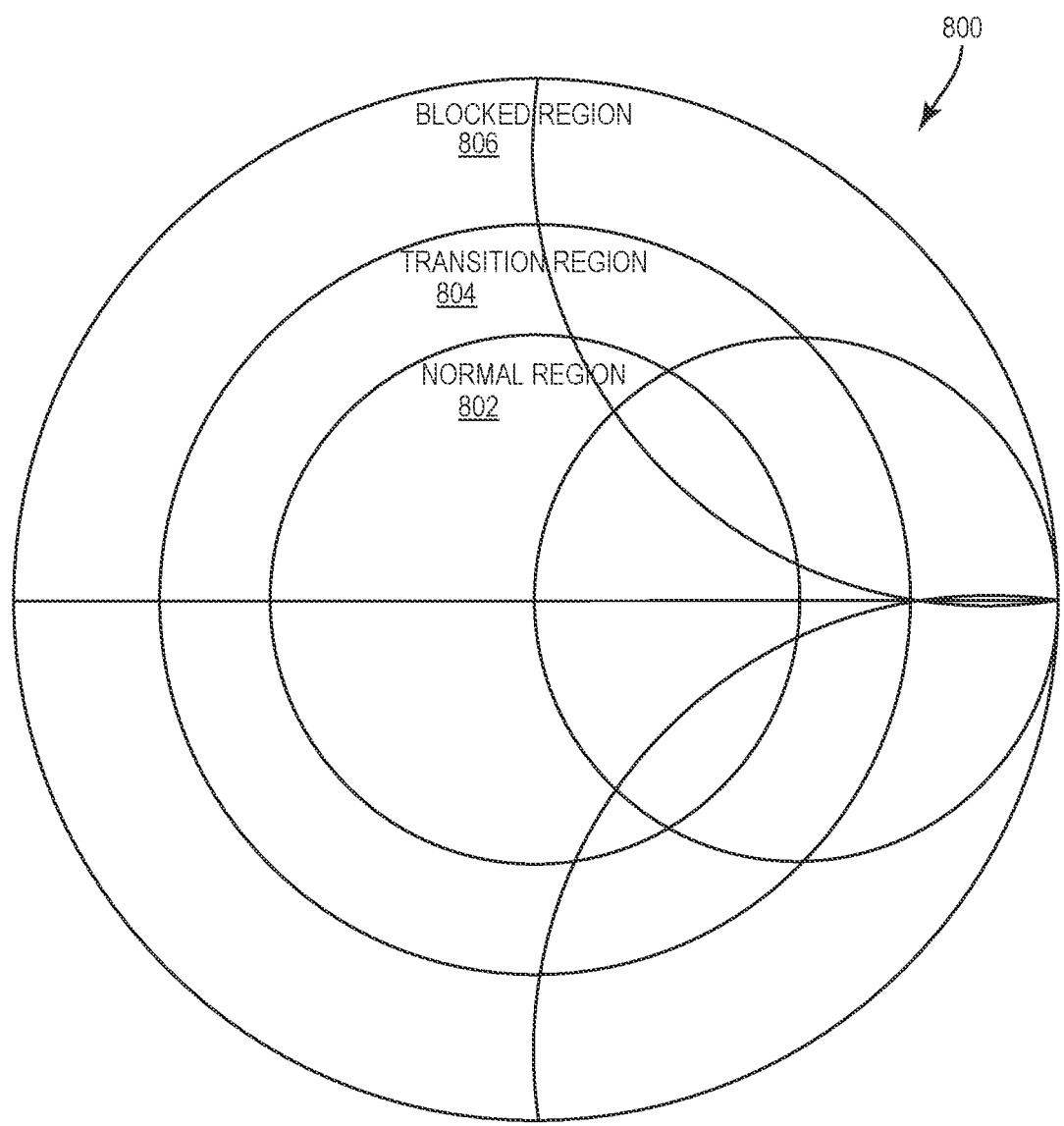
FIG. 8 illustrates an example Smith chart for the control system shown in FIG. 1 in accordance with embodiments of the disclosure.

FIG. 8 illustrates an example Smith chart 800 for the control system shown in FIG. 1 in accordance with embodiments of the disclosure. FIG. 8 divides the Smith chart 800 into three regions. A normal region 802 is a region where the output signal on the output signal line 172 is unaffected by the reverse power detection of the detector circuit 150. In the normal region 802, a steady forward power for the application (e.g., an RF application) or the electronic device is maintained.

A transition region 804 is a region where the output signal on the output signal line 172 is reduced by the reverse power detection of the detector circuit 150. In certain embodiments, the transition region 804 begins outside the region occupied by the antenna impedance.

A blocked region 806 is an outer edge of the Smith chart. In the blocked region, the reverse power signal can be very large due to high VSWR conditions. As such, the output signal on the output signal line 172 is reduced by one or more decibels to help the PA survive the high VSWR condition.

Figure 9:
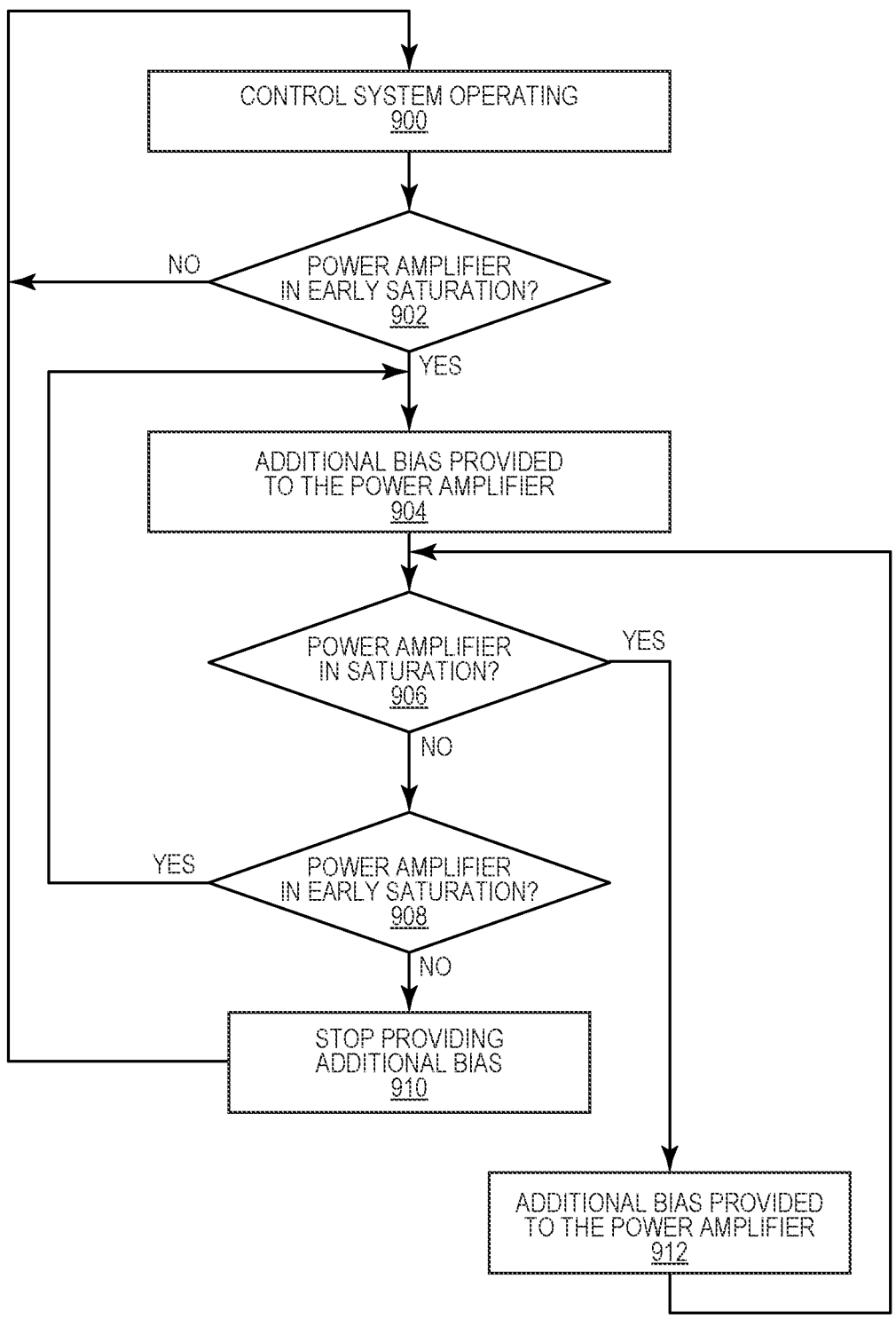
FIG. 9 illustrates a flowchart of an example method of operating a control system in accordance with embodiments of the disclosure.

FIG. 9 illustrates a flowchart of an example method of operating a control system in accordance with embodiments of the disclosure. Initially, as shown in block 900, the control system is operating and the VRAMP signal is received by the control system. For example, the VRAMP signal is received at the amplifier circuit 148 in FIG. 1. A determination is made at block 902 as to whether the PA (e.g., the PA 102 in FIG. 1) is in the early saturation state. As described earlier, the signal level of the vdet signal is used to detect whether the PA is in the early saturation state. If a determination is made at block 902 that the PA is not in the early saturation state, the method returns to block 900.

When a determination is made at block 902 that the PA is in the early saturation state (e.g., the signal level of the vdet signal is at a first signal level), the method continues at block 904. At block 904, the control system responsively provides, or causes to be provided, additional bias to the PA (e.g., the first additional bias). For example, based on a signal level of the vdet signal, the signal level of the second bias signal output from the second bias circuit 106 in FIG. 1 increases automatically (or is caused to increase automatically) to provide the additional bias to the PA. The additional bias assists or enables the PA in providing an increased output signal level. In FIG. 3, the additional bias is provided when the signal level of the VRAMP signal is at VR4 and the signal level of the collector bias signal is at SV2 (the first transition in the plot 310).

Next, as shown in block 906, a determination is made as to whether the PA is in the saturation state. If a determination is made that the PA is not in the saturation state, the method continues at block 908 where a determination is made as to whether the PA is in the early saturation state. If a determination is made that the PA is in the saturation state, the method returns to block 904. When a determination is made at block 908 that the PA is not in the early saturation state, the method passes to block 910 where the provision of the additional bias to the PA is stopped. The method then returns to block 900.

Returning to block 906, when a determination is made that the PA is in the saturation state (e.g., the signal level of the vdet signal is at a higher second signal level), the method continues at block 912. At block 912, the control system responsively provides, or causes to be provided, additional bias to the PA (e.g., second additional bias). The additional bias assists or enables the PA in providing an increased output signal level until the output signal reaches a maximum signal level. For example, based on a signal level of the vdet signal (e.g., the signal level of the vdet signal is at a higher second signal level), the signal level of the second base bias signal (the final_stage_bias) output from the final bias circuit increases automatically (or is caused to increase automatically) to provide the additional bias to the PA. In FIG. 3, the additional bias is provided when the signal level of the VRAMP signal is at VR5 and the signal level of the collector bias signal is at SV3 (the second transition in the plot 310). The method then returns to block 906.

FIG. 10 illustrates an example RF system 1000 in accordance with embodiments of the disclosure. The RF system 1000 includes RF input circuitry 1002 connected to a PA 1004. In a non-limiting nonexclusive example, the RF input circuitry 1002 includes one or more transceivers and/or one or more filters, and the PA 1004 is implemented as the PA 102 shown in FIG. 1.

Control circuitry 1006 and RF output circuitry 1008 are also connected to the PA 1004. The control circuitry 1006 is operable to control the signal level of the output signal (e.g., an amount of power output by the PA 1004) as described herein. The VRAMP signal on the signal line 146 (FIG. 1) may be received from the RF input circuitry 1002 or other circuitry in an electronic device. In certain embodiments, the control circuitry 1006 includes the components shown in FIG. 1 (with the exception of the PA 102) or one or more equivalents thereof. In a non-limiting nonexclusive example, the RF output circuitry 1008 includes one or more antennas.

Figure 11:
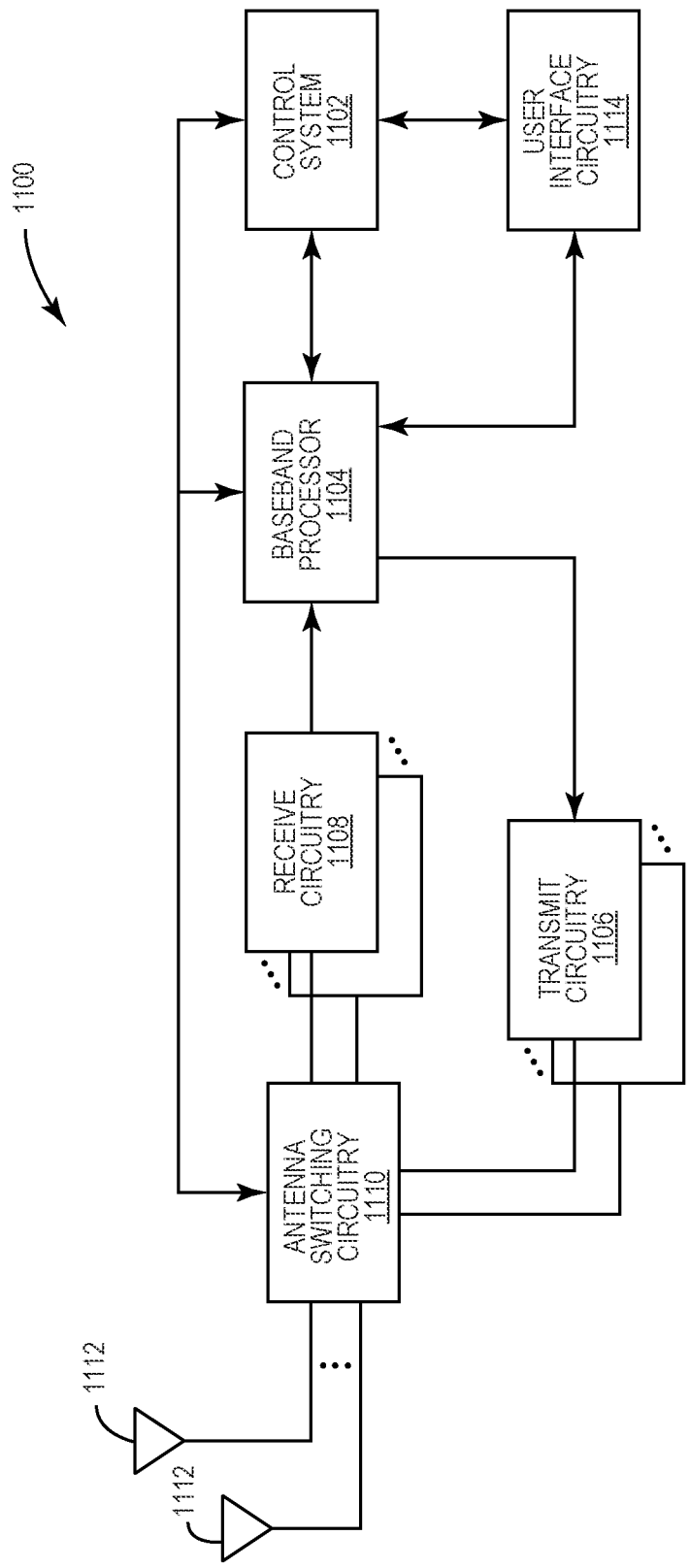
FIG. 11 illustrates example user elements that can include one or more control systems in accordance with embodiments of the disclosure.

FIG. 11 illustrates example user elements 1100 that can include one or more control systems in accordance with embodiments of the disclosure. The concepts described above may be implemented in various types of user elements, such as mobile terminals, smart watches, tablets, computers, navigation devices, access points, and like wireless communication devices that support wireless communications, such as cellular, wireless local area network (WLAN), Bluetooth, and near field communications. The illustrated user elements 1100 will generally include a control system 1102, a baseband processor 1104, transmit circuitry 1106, receive circuitry 1108, antenna switching circuitry 1110, multiple antennas 1112, and user interface circuitry 1114. In a non-limiting example, the control system 1102 can be a field-programmable gate array (FPGA) or an application-specific integrated circuit (ASIC), as an example. In this regard, the control system 1102 can include at least a microprocessor(s), an embedded memory circuit(s), and a communication bus interface(s). The receive circuitry 1108 receives radio frequency signals via the antennas 1112 and through the antenna switching circuitry 1110 from one or more base stations. A low noise amplifier and a filter of the receive circuitry 1108 cooperate to amplify and remove broadband interference from the received signal for processing. Downconversion and digitization circuitry (not shown) will then downconvert the filtered, received signal to an intermediate or baseband frequency signal, which is then digitized into one or more digital streams using analog-to-digital converter(s) (ADC).

The baseband processor 1104 processes the digitized received signal to extract the information or data bits conveyed in the received signal. This processing typically comprises demodulation, decoding, and error correction operations, as will be discussed on greater detail below. The baseband processor 1104 is generally implemented in one or more digital signal processors (DSPs) and application specific integrated circuits (ASICs).

For transmission, the baseband processor 1104 receives digitized data, which may represent voice, data, or control information, from the control system 1102, which it encodes for transmission. The encoded data is output to the transmit circuitry 1106, where a digital-to-analog converter(s) (DAC) converts the digitally encoded data into an analog signal and a modulator modulates the analog signal onto a carrier signal that is at a desired transmit frequency or frequencies. A power amplifier will amplify the modulated carrier signal to a level appropriate for transmission and deliver the modulated carrier signal to the multiple antennas 1112 through the antenna switching circuitry 1110. The multiple antennas 1112 and the replicated transmit and receive circuitries 1106, 1108 may provide spatial diversity. Modulation and processing details will be understood by those skilled in the art.

Those skilled in the art will recognize improvements and modifications to the present disclosure. All such improvements and modifications are considered within the scope of the concepts disclosed herein.

What is claimed is:

1. A control system, comprising:
    a detector circuit connected to an output of the power amplifier, the detector circuit operable to detect a reverse voltage and output a detector signal that provides an indication of a state of the power amplifier;
    a first bias circuit connected to the power amplifier, the first bias circuit operable to provide first additional bias to the power amplifier when the power amplifier is in an early saturation state; and
    a second bias circuit connected to the power amplifier, the second bias circuit operable to provide second additional bias to the power amplifier when the power amplifier is in a saturation state.

2. The control system of claim 1, wherein:
    the power amplifier comprises a driver amplifier and a final amplifier;
    the first bias circuit is connected to the driver amplifier; and
    the second bias circuit is connected to the final amplifier.

3. The control system of claim 2, further comprising a third bias circuit connected to the driver amplifier of the power amplifier.

4. The control system of claim 2, wherein the driver amplifier is a multistage driver amplifier.

5. The control system of claim 1, wherein the detector circuit is further operable to detect a forward voltage.

6. The control system of claim 5, wherein the detector circuit comprises a first diode and a second diode connected to a directional coupler.

7. The control system of claim 1, further comprising a scaling circuit connected to the detector circuit, the scaling circuit adjustable to support multiple radio frequency bands.

8. The control system of claim 1, further comprising a saturation correction circuit connected to the power amplifier, the saturation correction circuit providing a first feedback path and a second feedback path.

9. The control system of claim 1, further comprising a feedback circuit connected to the power amplifier, the feedback circuit operable to output a feedback signal that causes additional bias to be provided to the power amplifier.

10. A radio frequency (RF) system, comprising:
    RF input circuitry connected to a power amplifier;
    RF output circuitry connected to the power amplifier; and
    a control system, comprising:
        a detector circuit connected to an output of the power amplifier, the detector circuit operable to detect a reverse voltage and output a detector signal that provides an indication of a state of the power amplifier;
        a first bias circuit connected to the power amplifier, the first bias circuit operable to provide first additional bias to the power amplifier when the power amplifier is in an early saturation state; and
        a second bias circuit connected to the power amplifier, the second bias circuit operable to provide second additional bias to the power amplifier when the power amplifier is in an saturation state.

11. The RF system of claim 10, wherein the RF input circuitry comprises a transceiver.

12. The RF system of claim 10, wherein the RF output circuitry comprises an antenna.

13. The RF system of claim 10, wherein:
    the power amplifier comprises a driver amplifier and a final amplifier;
    the first bias circuit is connected to the driver amplifier; and
    the second bias circuit is connected to the final amplifier.

14. The RF system of claim 13, further comprising a third bias circuit connected to the driver amplifier of the power amplifier.

15. The RF system of claim 10, wherein:
    the detector circuit is further operable to detect a forward voltage; and
    the detector circuit comprises a first diode and a second diode connected to a directional coupler.

16. The RF system of claim 10, further comprising:
    a saturation correction circuit connected to the power amplifier, the saturation correction circuit providing a first feedback path and a second feedback path; and
    a feedback circuit connected to the power amplifier, the feedback circuit operable to output a feedback signal that causes additional bias to be provided to the power amplifier.

17. The RF system of claim 10, further comprising a scaling circuit connected to the detector circuit, the scaling circuit adjustable to support multiple RF bands.

18. A method of operating a control system in an electronic device, the method comprising:
    determining a power amplifier is in an early saturation state based on a first signal level of a detector signal that is output from a detector circuit connected to an output of the power amplifier, the detector circuit operable to detect a forward voltage and a reverse voltage;
    based on determining the power amplifier is in the early saturation state, providing first additional bias to the power amplifier;
    determining the power amplifier is in a saturation state based on detecting a second signal level of the detector signal, wherein the second signal level is greater than the first signal level; and
    based on determining the power amplifier is in the saturation state, providing second additional bias to the power amplifier.

19. The method of claim 18, wherein:
    the power amplifier comprises a driver amplifier and a final amplifier;
    the first additional bias is provided to the driver amplifier; and
    the second additional bias is provided to the final amplifier.

20. The method of claim 18, wherein:
    the first signal level of the detector signal is based on a first level of detected reverse power;
    the second signal level of the detector signal is based on a second level of detected reverse power; and
    the second level is greater than the first level.

* * * * *